US008802200B2

(12) United States Patent
Lee et al.

(10) Patent No.: US 8,802,200 B2
(45) Date of Patent: Aug. 12, 2014

(54) METHOD AND APPARATUS FOR CLEANING ORGANIC DEPOSITION MATERIALS

(75) Inventors: Jung-Min Lee, Yongin (KR);
Choong-Ho Lee, Yongin (KR);
Yoon-Chan Oh, Yongin (KR);
Hee-Seong Jeong, Yongin (KR)

(73) Assignee: Samsung Display Co., Ltd., Yongin-si (KR)

(*) Notice: Subject to any disclaimer, the term of this patent is extended or adjusted under 35 U.S.C. 154(b) by 725 days.

(21) Appl. No.: 12/795,896

(22) Filed: Jun. 8, 2010

(65) Prior Publication Data

US 2010/0310759 A1    Dec. 9, 2010

(30) Foreign Application Priority Data

Jun. 9, 2009  (KR) .................. 10-2009-0051064
Feb. 10, 2010 (KR) .................. 10-2010-0012406

(51) Int. Cl.
*B05D 3/00* (2006.01)
(52) U.S. Cl.
USPC ................. 427/532; 427/58; 118/50; 118/66; 118/715; 118/721
(58) Field of Classification Search
USPC ............... 427/58, 532; 118/50, 66, 715, 721; 313/504
See application file for complete search history.

(56) References Cited

U.S. PATENT DOCUMENTS

| | | | |
|---|---|---|---|
| 6,274,198 B1 | 8/2001 | Dautartas | |
| 6,371,451 B1 | 4/2002 | Choi | |
| 6,749,906 B2 | 6/2004 | Van Slyke | |
| 2001/0006827 A1 | 7/2001 | Yamazaki et al. | |
| 2002/0076847 A1 | 6/2002 | Yamada et al. | |
| 2002/0168577 A1 | 11/2002 | Yoon | |
| 2003/0101937 A1 | 6/2003 | Van Slyke et al. | |
| 2003/0168013 A1 | 9/2003 | Freeman et al. | |

(Continued)

FOREIGN PATENT DOCUMENTS

| | | |
|---|---|---|
| EP | 1 413 644 | 4/2004 |
| EP | 1 518 940 | 3/2005 |

(Continued)

OTHER PUBLICATIONS

U.S. Appl. No. 13/031,756, filed Feb. 22, 2011, Yong Sup Choi et al., Samsung Mobile Display Co., Ltd.

(Continued)

*Primary Examiner* — Michael Cleveland
*Assistant Examiner* — Xiao Zhao
(74) *Attorney, Agent, or Firm* — Christie, Parker & Hale, LLP

(57) ABSTRACT

A method of cleaning off organic deposition material accumulated on a mask includes forming an organic deposition material pattern on a substrate using the mask, which includes a plurality of slots, in a deposition chamber including a deposition source; transporting the mask to a stock chamber that is maintained at a vacuum and adjacent to the deposition chamber; and partially cleaning off the organic deposition material accumulated along the boundaries of the slots of the mask in the stock chamber. A system to clean off an organic deposition material accumulated on a mask having a plurality of slots, includes a deposition chamber including a deposition source; and a stock chamber that is maintained at substantially the same vacuum as the deposition chamber and includes a cleaning device that cleans off the organic deposition material accumulated on the mask.

27 Claims, 14 Drawing Sheets

(56) References Cited

U.S. PATENT DOCUMENTS

| | | | |
|---|---|---|---|
| 2003/0221614 | A1 | 12/2003 | Kang et al. |
| 2004/0096754 | A1* | 5/2004 | Jung ............................. 430/5 |
| 2004/0115338 | A1* | 6/2004 | Yoneda ........................ 427/66 |
| 2004/0127066 | A1 | 7/2004 | Jung |
| 2004/0134428 | A1 | 7/2004 | Sasaki et al. |
| 2004/0142108 | A1 | 7/2004 | Atobe et al. |
| 2004/0144321 | A1 | 7/2004 | Grace et al. |
| 2004/0194702 | A1 | 10/2004 | Sasaki et al. |
| 2005/0016461 | A1 | 1/2005 | Klug et al. |
| 2005/0031836 | A1 | 2/2005 | Hirai |
| 2005/0037136 | A1 | 2/2005 | Yamamoto |
| 2005/0166842 | A1 | 8/2005 | Sakamoto |
| 2006/0012290 | A1* | 1/2006 | Kang ........................... 313/504 |
| 2006/0072085 | A1* | 4/2006 | Compen et al. ............... 355/30 |
| 2006/0144325 | A1 | 7/2006 | Jung et al. |
| 2006/0174829 | A1 | 8/2006 | An et al. |
| 2006/0205101 | A1 | 9/2006 | Lee et al. |
| 2007/0009652 | A1* | 1/2007 | Manz et al. .................... 427/58 |
| 2007/0077358 | A1 | 4/2007 | Jeong et al. |
| 2007/0178708 | A1 | 8/2007 | Ukigaya |
| 2008/0018236 | A1 | 1/2008 | Arai et al. |
| 2008/0115729 | A1 | 5/2008 | Oda et al. |
| 2008/0131587 | A1 | 6/2008 | Boroson et al. |
| 2008/0216741 | A1 | 9/2008 | Ling et al. |
| 2009/0017192 | A1 | 1/2009 | Matsuura |
| 2009/0232976 | A1 | 9/2009 | Yoon et al. |

FOREIGN PATENT DOCUMENTS

| | | |
|---|---|---|
| JP | 4-272170 | 9/1992 |
| JP | 2000-68054 | 3/2000 |
| JP | 2001-52862 | 2/2001 |
| JP | 2001-93667 | 4/2001 |
| JP | 2002-175878 | 6/2002 |
| JP | 2003-3250 | 1/2003 |
| JP | 2003-77662 | 3/2003 |
| JP | 2003-157973 | 5/2003 |
| JP | 2003-297562 | 10/2003 |
| JP | 2004-43898 | 2/2004 |
| JP | 2004-103269 | 4/2004 |
| JP | 2004-103341 | 4/2004 |
| JP | 2004-192850 | 7/2004 |
| JP | 2004-199919 | 7/2004 |
| JP | 2005-44592 | 2/2005 |
| JP | 2005-235568 | 9/2005 |
| JP | 2005-293968 | 10/2005 |
| JP | 2005-296737 | 10/2005 |
| JP | 2006-275433 | 10/2006 |
| JP | 2007-47293 | 2/2007 |
| JP | 2008-121098 | 5/2008 |
| JP | 2009-19243 | 1/2009 |
| JP | 2009-87910 | 4/2009 |
| JP | 2009-117231 | 5/2009 |
| KR | 10-0257219 | 2/2000 |
| KR | 10-2000-0019254 | 4/2000 |
| KR | 10-2000-0023929 | 5/2000 |
| KR | 10-2001-0059939 | 7/2001 |
| KR | 10-2002-0000201 | 1/2002 |
| KR | 10-2002-0050922 | 6/2002 |
| KR | 10-2002-0090934 | 12/2002 |
| KR | 10-0405080 | 10/2003 |
| KR | 10-2003-0091947 | 12/2003 |
| KR | 10-2003-0093959 | 12/2003 |
| KR | 10-2004-0050045 | 6/2004 |
| KR | 10-2004-0069281 | 8/2004 |
| KR | 10-2004-0084747 | 10/2004 |
| KR | 10-0463212 | 12/2004 |
| KR | 10-0520159 | 9/2005 |
| KR | 10-2006-0008602 | 1/2006 |
| KR | 10-2006-0018745 | 3/2006 |
| KR | 10-2006-0073367 | 6/2006 |
| KR | 10-2006-0080475 | 7/2006 |
| KR | 10-2006-0080481 | 7/2006 |
| KR | 10-2006-0080482 | 7/2006 |
| KR | 10-2006-0083510 | 7/2006 |
| KR | 10-2006-0104675 | 10/2006 |
| KR | 10-2006-0104677 | 10/2006 |
| KR | 10-2006-0109627 | 10/2006 |
| KR | 10-0646160 | 11/2006 |
| KR | 10-0687007 | 2/2007 |
| KR | 10-2007-0025164 | 3/2007 |
| KR | 10-0696547 | 3/2007 |
| KR | 10-0698033 | 3/2007 |
| KR | 10-0700466 | 3/2007 |
| KR | 10-2007-0035796 | 4/2007 |
| KR | 10-0711885 | 4/2007 |
| KR | 10-2007-0050793 | 5/2007 |
| KR | 10-0723627 | 5/2007 |
| KR | 10-0726132 | 6/2007 |
| KR | 10-2007-0078713 | 8/2007 |
| KR | 10-2007-0080635 | 8/2007 |
| KR | 10-2007-0101842 | 10/2007 |
| KR | 10-2007-0105595 | 10/2007 |
| KR | 10-0770653 | 10/2007 |
| KR | 10-2008-0001184 | 1/2008 |
| KR | 10-0797787 | 1/2008 |
| KR | 10-0800125 | 1/2008 |
| KR | 10-0815265 | 3/2008 |
| KR | 10-0823508 | 4/2008 |
| KR | 10-0827760 | 4/2008 |
| KR | 10-0839380 | 6/2008 |
| KR | 10-2008-0060400 | 7/2008 |
| KR | 10-2008-0061132 | 7/2008 |
| KR | 10-2008-0062212 | 7/2008 |
| KR | 10-2009-0038733 | 4/2009 |
| KR | 10-2009-0097453 | 9/2009 |

OTHER PUBLICATIONS

KIPO Registration Determination Certificate dated Feb. 24, 2012, for Korean priority Patent application 10-2010-0012406, 5 pages.

English-language abstract of Korean Publication No. 10-2002-0034272.

English-language abstract of Korean Publication No. 10-2002-0088662.

English-language abstract of Korean Publication No. 10-2006-0126267.

KIPO Office action dated Apr. 29, 2011, for Korean priority Patent application 10-2010-0012406.

English-language abstract of Korean Publication No. KR 10-2002-0034272.

English-language abstract of Korean Publication No. KR 10-2002-0056238.

English-language abstract of Korean Publication No. KR 10-2002-0088662.

English-language abstract of Korean Publication No. KR 10-2005-0045619.

English-language abstract of Korean Publication No. KR 10-2006-0126267.

English-language abstract of Korean Publication No. KR 10-2008-0038650.

U.S. Appl. No. 12/784,774, filed May 21, 2010, Choong-Ho Lee et al., Samsung Mobile Display Co., Ltd.

U.S. Appl. No. 13/014,225, filed Jan. 26, 2011, Jong-Won Hong et al., Samsung Mobile Display Co., Ltd.

U.S. Appl. No. 12/797,858, filed Jun. 10, 2010, Choong-Ho Lee et al., Samsung Mobile Display Co., Ltd.

U.S. Appl. No. 12/836,760, filed Jul. 15, 2010, Jong-Heon Kim, et al., Samsung Mobile Display Co., Ltd.

U.S. Appl. No. 12/784,804, filed May 21, 2010, Choong-Ho Lee, et al., Samsung Mobile Display Co., Ltd.

U.S. Appl. No. 12/849,193, filed Aug. 3, 2010, Ji-Sook Oh et al., Samsung Mobile Display Co., Ltd.

U.S. Appl. No. 12/979,193, filed Dec. 28, 2010, Hyun Sook Park et al., Samsung Mobile Display Co., Ltd.

U.S. Appl. No. 12/820,355, filed Jun. 22, 2010, Yong-Sup Choi et al., Samsung Mobile Display Co., Ltd.

U.S. Appl. No. 12/950,361, filed Nov. 19, 2010, Choong-Ho Lee, et al., Samsung Mobile Display Co., Ltd.

U.S. Appl. No. 12/856,942, filed Aug. 16, 2010, Yun-Mi Lee et al.,

(56) References Cited

OTHER PUBLICATIONS

Samsung Mobile Display Co., Ltd.
U.S. Appl. No. 12/814,816, filed Jun. 14, 2010, Jung-Min Lee et al., Samsung Mobile Display Co., Ltd.
U.S. Appl. No. 12/868,099, filed Aug. 25, 2010, Hee-Cheol Kang, et al., Samsung Mobile Display Co., Ltd.
U.S. Appl. No. 12/862,153, filed Aug. 24, 2010, Hee-Cheol Kang, et al., Samsung Mobile Display Co., Ltd.
U.S. Appl. No. 12/869,830, filed Aug. 27, 2010, Chang-Mog Jo, et al., Samsung Mobile Display Co., Ltd.
U.S. Appl. No. 12/849,092, filed Aug. 3, 2010, Choong-Ho Lee et al., Samsung Mobile Display Co., Ltd.
U.S. Appl. No. 12/873,556, filed Sep. 1, 2010, Young-Mook Choi, et al., Samsung Mobile Display Co., Ltd.
U.S. Appl. No. 12/873,689, filed Sep. 1, 2010, Young-Mook Choi, et al., Samsung Mobile Display Co., Ltd.
U.S. Appl. No. 12/815,673, filed Jun. 15, 2010, Jung-Min Lee, Samsung Mobile Display Co., Ltd.
U.S. Appl. No. 12/794,093, filed Jun. 4, 2010, Jung-Min Lee et al., Samsung Mobile Display Co., Ltd.
U.S. Appl. No. 12/862,125, filed Aug. 24, 2010, Jae-Kwang Ryu et al., Samsung Mobile Display Co., Ltd.
U.S. Appl. No. 12/795,001, filed Jun. 7, 2010, Choong-Ho Lee et al., Samsung Mobile Display Co., Ltd.
U.S. Appl. No. 12/813,786, filed Jun. 11, 2010, Choong-Ho Lee et al., Samsung Mobile Display Co., Ltd.
U.S. Appl. No. 12/820,270, filed Jun. 22, 2010, Jung-Min Lee et al., Samsung Mobile Display Co., Ltd.
U.S. Appl. No. 12/907,396, filed Oct. 19, 2010, Yong-Sup Choi, et al., Samsung Mobile Display Co., Ltd.
U.S. Appl. No. 12/987,569, filed Jan. 10, 2011, Yun-Mi Lee et al., Samsung Mobile Display Co., Ltd.
U.S. Appl. No. 12/984,289, filed Jan. 4, 2011, Jung-Yeong Kim et al., Samsung Mobile Display Co., Ltd.

* cited by examiner

METHOD AND APPARATUS FOR CLEANING ORGANIC DEPOSITION MATERIALS

CROSS-REFERENCE TO RELATED APPLICATIONS

This application claims the benefit of Korean Application No. 10-2009-0051064, filed Jun. 9, 2009, and Korean Application No. 10-2010-0012406, filed, Feb. 10, 2010 in the Korean Intellectual Property Office, the disclosure of which is incorporated herein by reference.

BACKGROUND OF THE INVENTION

1. Field of the Invention

Aspects of the present invention relate to a method and system to clean organic deposition materials accumulated on a mask used in a process of depositing organic deposition materials.

2. Description of the Related Art

Organic light-emitting display devices have a larger viewing angle, better contrast characteristics, and a faster response rate than other display devices, and thus have drawn attention as a next-generation display device.

In general, an organic light-emitting display device has a stacked structure including an anode, a cathode, and an emission layer interposed between the anode and the cathode. The device may display images in color when holes and electrons, injected respectively from the anode and the cathode, recombine in the emission layer such that light is emitted. To improve the light-emission efficiency of such a structure, intermediate layers, including an electron injection layer, an electron transport layer, a hole transport layer, a hole injection layer, etc., may be additionally interposed between the emission layer and each of the electrodes.

In this regard, an organic thin film such as an emission layer and an intermediate layer may be formed in a fine pattern by deposition. When an organic light-emitting display device is manufactured by using the deposition method, a fine metal mask (FMM) having the same pattern as a thin film to be formed is disposed to closely contact a substrate, and a thin film material is deposited over the FMM in order to form the thin film having the desired pattern.

Meanwhile, devices within a deposition chamber including a mask typically should be subjected to preventive maintenance (PM) according to a predetermined cycle count when the deposition process is repeatedly performed. In the process of manufacturing organic light-emitting display devices using an FMM, the FMM may separated to be cleaned according to a predetermined PM cycle count (e.g., after every 80 depositions on the substrate).

SUMMARY OF THE INVENTION

Aspects of the present invention provide a method and system to clean off organic deposition materials from a mask used in a deposition process to form organic deposition material patterns, whereby a cleaning cycle of the mask and a preventive maintenance (PM) cycle of the deposition process may be extended.

According to an aspect of the present invention, there is provided a method of cleaning off an organic deposition material accumulated on a mask used to form an organic deposition material pattern on a substrate, the method including: forming the organic deposition material pattern on the substrate using the mask in a deposition chamber including a deposition source, wherein the mask includes a plurality of slots; transporting the mask to a stock chamber that is maintained at a vacuum and adjacent to the deposition chamber; and cleaning off the organic deposition material accumulated on the mask in the stock chamber.

According to a non-limiting aspect, boundaries of the slots may be inclined.

According to a non-limiting aspect, the slots may be disposed to be substantially parallel to each other and extend in a predetermined direction.

According to a non-limiting aspect, the substrate on which the organic deposition material pattern is formed may include a substrate for an organic light emitting device (OLED) panel.

According to a non-limiting aspect, at least one organic deposition material selected from the group consisting of organic deposition materials used to form an emission layer, an electron injection layer, an electron transport layer, a hole injection layer, and a hole transport layer may be deposited on the substrate for an OLED panel.

According to a non-limiting aspect, the organic deposition material pattern may be formed by disposing the mask in close contact with the substrate, and depositing the organic deposition material on the substrate while the deposition source is moved relative to the mask.

According to a non-limiting aspect, the organic deposition material pattern may be formed by spacing the mask apart from the substrate by a predetermined distance, and wherein the organic deposition material is deposited on the substrate while the deposition source is fixed relative to the mask.

According to a non-limiting aspect, a plurality of first slits may be disposed along a first direction at one side of the deposition source, and a plurality of barrier walls that partition a space between the deposition source and the mask into a plurality of sub-deposition spaces are disposed along the first direction and a barrier wall assembly including a barrier wall frame that surrounds the barrier walls are disposed between the deposition source and the mask, wherein the barrier wall assembly and the mask are detachable.

According to a non-limiting aspect, the plurality of first slots formed in the mask may provide a portion of the organic deposition material pattern to be formed on the substrate, and deposition of the organic deposition material on the substrate may be conducted by scanning the mask along a direction perpendicular to the first direction with respect to the substrate.

According to a non-limiting aspect, a plurality of second slits may be disposed along a first direction at one side of the deposition source, and a connection member that guides the deposition material which is discharged from the deposition source to the substrate may be disposed between the deposition source and the mask, wherein the connection member and the mask are detachable.

According to a non-limiting aspect, the plurality of second slots formed in the mask may form a portion of the organic deposition material pattern to be formed on the substrate, and deposition of the organic deposition material on the substrate may be conducted by scanning the substrate along the first direction with respect to the mask.

According to a non-limiting aspect, the cleaning off of the organic deposition material may be performed using plasma.

According to a non-limiting aspect, the cleaning off of the organic deposition material may be performed by cleaning off the organic deposition material accumulated along the boundaries of the slots formed in the mask.

According to a non-limiting aspect, the cleaning off of the organic deposition material may be performed using a short wavelength laser beam.

According to a non-limiting aspect, the short wavelength laser beam may have a wavelength ranging from 200 nm to 500 nm.

According to a non-limiting aspect, the short wavelength laser beam may be irradiated substantially perpendicular to the surface of the mask facing the substrate.

According to a non-limiting aspect, the scan rate of the short wavelength laser beam may be determined such that the energy of the short wavelength laser beam reaches the organic deposition material more quickly than the energy reaches the mask.

According to a non-limiting aspect, the temperature of the organic deposition material to which the short wavelength laser beam is irradiated may be in the range of 600° C. to 1200° C.

According to a non-limiting aspect, the cleaning off of the organic deposition material may be performed by further disposing a blocking mask having a pattern with a plurality of openings corresponding to the boundaries of the slots of the mask in front of the mask.

According to a non-limiting aspect, the cleaning off of the organic deposition material may be performed using a line-type short wavelength laser beam simultaneously irradiated to the plurality of openings contained in the blocking mask.

According to a non-limiting aspect, the cleaning off of the organic deposition material may be performed using UV rays.

According to a non-limiting aspect, the cleaning off of the organic deposition material may be performed using plasma.

According to a non-limiting aspect, the forming the organic deposition material pattern and the cleaning off of the organic deposition material may be performed at substantially the same degree of vacuum.

According to a non-limiting aspect, the degrees of vacuum of the deposition chamber and the stock chamber may be maintained at about 10E-7 Torr or less.

According to another aspect of the present invention, there is provided a system to clean off an organic deposition material accumulated on a mask used to form an organic deposition material pattern on a substrate, wherein the mask has a plurality of slots, the system including: a deposition chamber including a deposition source; and a stock chamber that is maintained at substantially the same vacuum as the deposition chamber and includes a cleaning device that cleans off the organic deposition material accumulated on the mask.

According to a non-limiting aspect, the system may further include an opening and closing device between the deposition chamber and the stock chamber to isolate the deposition chamber and the stock chamber from each other.

According to a non-limiting aspect, the system may further include a transporting device to transport the mask between the deposition chamber and the stock chamber.

According to a non-limiting aspect, the transporting device may be adapted to detach the mask from the substrate and transport the mask from the deposition chamber to the stock chamber.

According to a non-limiting aspect, the cleaning device may clean off the organic deposition material using plasma.

According to a non-limiting aspect, the cleaning device may clean the organic deposition material accumulated on the boundaries of the slots.

According to a non-limiting aspect, the cleaning device may use a short wavelength laser beam having a wavelength ranging from 200 nm to 500 nm.

According to a non-limiting aspect, the system may further include a blocking mask having a pattern with a plurality of openings corresponding to the boundaries of the slots of the mask, wherein the blocking mask is disposed between the cleaning device of the stock chamber and the mask.

According to a non-limiting aspect, the cleaning device may use a line-type short wavelength laser beam simultaneously irradiated to the plurality of openings contained in the blocking mask.

According to a non-limiting aspect, the cleaning device may use plasma.

According to a non-limiting aspect, the cleaning device may use UV rays.

According to a non-limiting aspect, the degree of vacuum in the deposition chamber and the stock chamber may be at about 10E-7 Torr or less.

According to a non-limiting aspect, the temperature of the organic deposition material in the stock chamber may be in the range of 600° C. to 1200° C.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
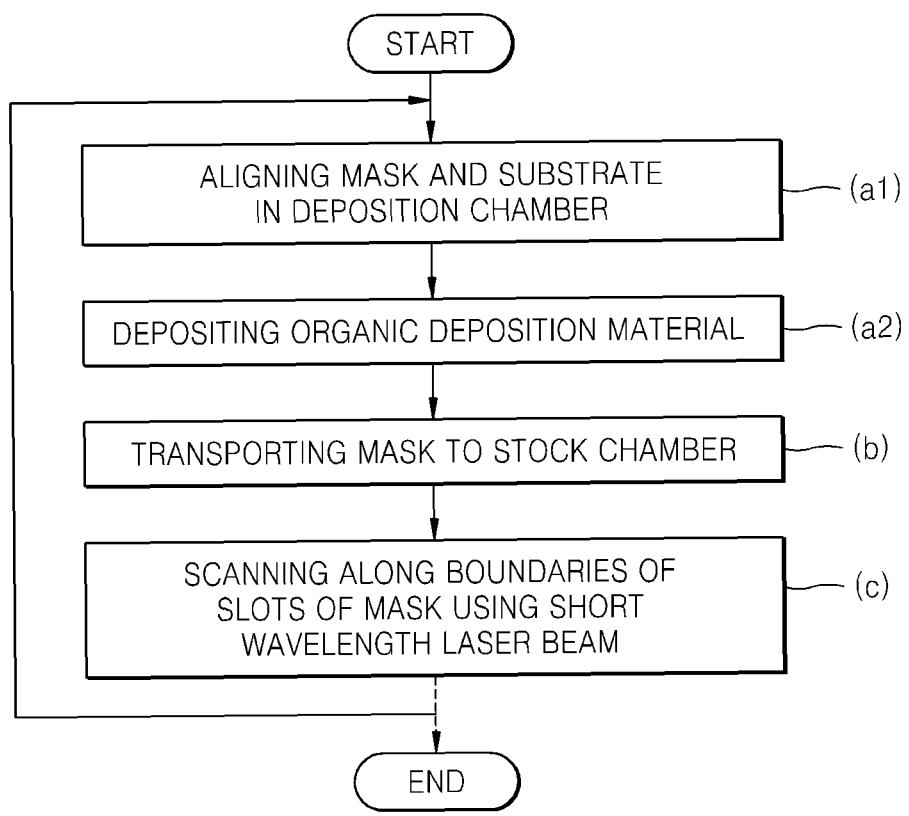
FIG. 1 is a flowchart illustrating a method of cleaning an organic deposition material accumulated on a mask used to deposit an organic pattern on a substrate.

Reference will now be made in detail to the present embodiments of the present invention, examples of which are illustrated in the accompanying drawings, wherein like reference numerals refer to the like elements throughout. The embodiments are described below in order to explain aspects of the present invention by referring to the figures.

FIG. 1 is a flowchart illustrating a method of cleaning an organic deposition material accumulated on a mask used to form an organic pattern on a substrate. As used herein, the term "cleaning" an organic deposition material accumulated on a mask typically refers to removing or cleaning off the accumulated organic deposition material from the mask.

Referring to FIG. 1, before cleaning the organic deposition material accumulated on the surface of the mask used to form an organic deposition material pattern on the substrate, a mask including a plurality of slots is aligned on the substrate in a deposition chamber (operation a1), and a number of depositions of the organic deposition material on the substrate are performed (operation a2).

In this regard, the substrate may be a substrate for an organic light emitting device (OLED) panel. The substrate for the OLED panel includes organic thin film micro patterns for intermediate layers such as an emission layer, an electron injection layer, an electron transport layer, a hole transport layer and a hole injection layer between an anode and a cathode. In order to form the organic thin film micro patterns by deposition, masks having patterns corresponding to the organic thin film micro patterns are prepared. The masks and the substrate for an OLED panel are aligned in a deposition chamber that is maintained at a high vacuum such that the pattern of the mask corresponds with the pattern to be formed on the substrate. The method according to the present embodiment is not only applicable to substrates for OLED panels, but also any substrate on which organic thin film patterns are formed.

In the deposition chamber, organic deposition material that has been vaporized in a deposition source passes through the mask onto the subject, thereby forming an organic pattern corresponding to the pattern of the mask. In the deposition process, a single mask may be used to deposit the organic deposition material on a plurality of substrates for a predetermined number of repetitions.

Meanwhile, while the deposition process is repeatedly performed, devices within the deposition chamber including the mask are subjected to preventive maintenance (PM) at a predetermined cycle. Since the deposition process is stopped while the PM is performed, and it takes a long time to reach deposition conditions including the degree of vacuum required for the deposition process after the PM is terminated, a short PM cycle may decrease productivity.

In general, the PM cycle is determined according to the shortest cycle among PM cycles required for each of the elements in the deposition chamber. In particular, since the mask on which organic deposition materials are excessively accumulated during the deposition may influence the formation of the organic thin film pattern, the mask needs to be cleaned at a relatively short predetermined cycle. The cleaning cycle of the cleaning of the mask influences the PM cycle.

Conventionally, the cleaning of the mask is performed while the PM is performed. A wet cleaning process using a chemical solvent generally used to clean a mask during a semiconductor process may not be used in the deposition chamber since the OLED display device is vulnerable to oxygen and moisture. Thus, a separate cleaning system is used outside of the deposition chamber.

Accordingly, the method of cleaning off organic deposition materials according to the present embodiment includes transporting a mask that has been used for a plurality of depositions to a stock chamber that is maintained at a high vacuum and that is adjacent to the deposition chamber, and cleaning the mask in the stock chamber (operation b).

In addition, the method of cleaning organic deposition materials according to the present embodiment includes locally cleaning the mask transported to the stock chamber by scanning the inclined surface of the mask pattern on which organic deposition material is accumulated (operation c).

Hereinafter, the method and system to clean off the organic deposition material accumulated on the mask used for the deposition of the organic deposition material pattern will be described in more detail referring to FIGS. 2 to 14.

Figure 2:
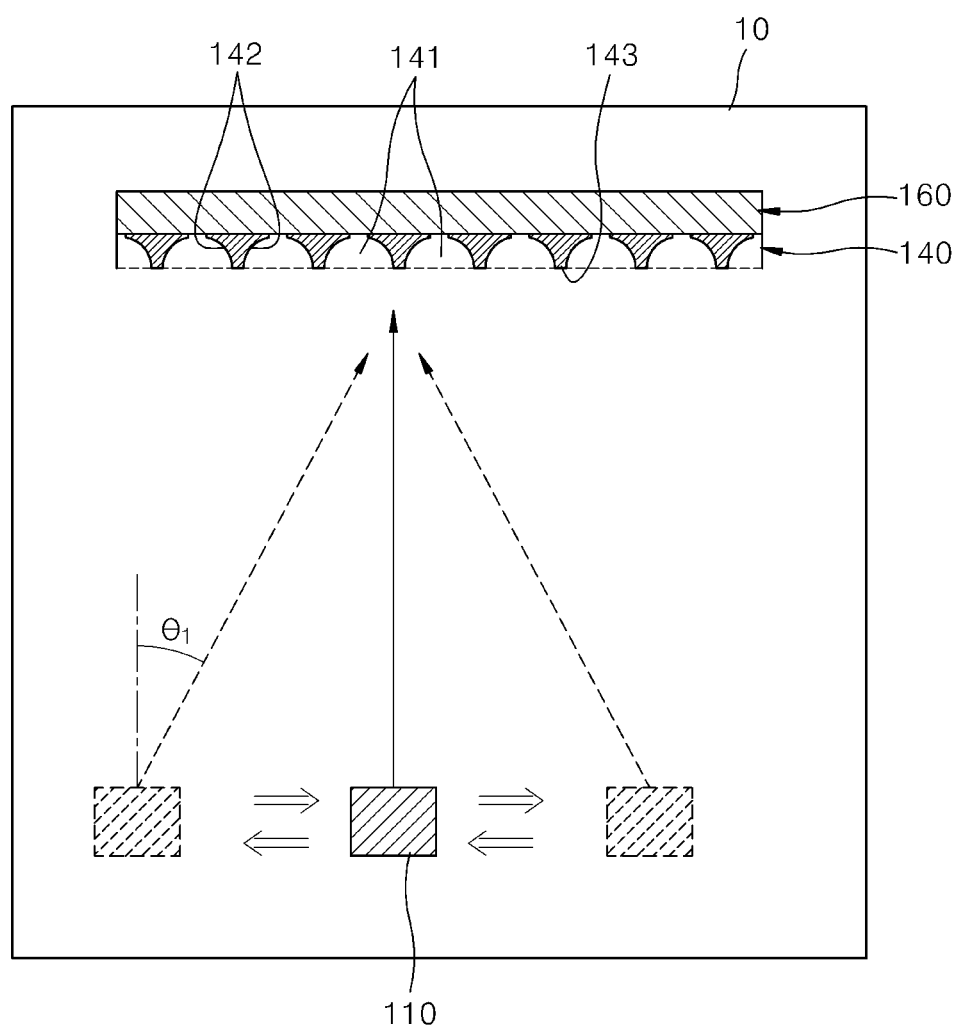
FIG. 2 is a schematic view for describing deposition of an organic deposition material on a substrate for an OLED panel using a fine metal mask (FMM) in a deposition chamber.

FIG. 2 is a schematic view to describe deposition of an organic deposition material on a substrate 160 for an OLED panel using a fine metal mask (FMM) 140 in a deposition chamber 10.

Referring to FIG. 2, a deposition of an organic deposition material on a substrate 160 for an OELD panel using a FMM 140 will be described.

The FMM 140 has the same size as the substrate 160 in order to have the same pattern as an organic thin film pattern to be formed on the substrate 160. The FMM 140 is aligned on the substrate 160 in firm contact with the substrate 160.

In this regard, the FMM 140 may have a striped shape. In the etching of the pattern of the FMM 140, a plurality of first slots 141 that are substantially parallel to each other and extend in a predetermined direction are formed in the FMM 140. Also, on a side of the FMM 140 opposite to that facing the substrate 160, the surfaces of the boundaries 142 between the first slots 141 are formed to be oblique with respect to bases 143. In other words, the first slots 141 are wider on the side of the FMM 140 opposite to the side that faces the substrate 160 and the boundary surfaces 142 between the first slots 141 extend at an angle between the side of the FMM 140 that faces the substrate 160 and the surface of the substrate and the side of the FMM 140 opposite to the side that faces the substrate 160. The side of the FMM 140 opposite to the side that faces the substrate 160 includes a base surface 143 between the first slots 141.

A deposition source 110 disposed apart from the FMM 140 and the substrate 160 includes a crucible containing the organic deposition material to be deposited on the substrate 160. The deposition source 110, the FMM 140 and the substrate 160 are disposed in the deposition chamber 10. The deposition chamber 10 may be maintained at a high vacuum in order to allow the organic deposition material to move in a straight direction. The degree of vacuum in the deposition chamber 10 may be equal to or less than about 10E-7 Torr.

The organic deposition material is vaporized in the deposition source 110 and passes through the first slots 141 formed in the FMM 140 to be deposited on the substrate 160. The organic deposition material pattern is formed on the substrate 160 while the deposition source 110 is moved relative to the FMM 140. The organic deposition material vaporized in the deposition source 110 is deposited within a predetermined angle θ1 with respect to the surface of the FMM 140. The predetermined angle θ1 is generally equal to or less than 55°.

The organic deposition material that has not passed through the first slots 141 accumulates on the bases 143 and the boundaries 142 of the first slots 141 of the FMM 140.

Figure 3:
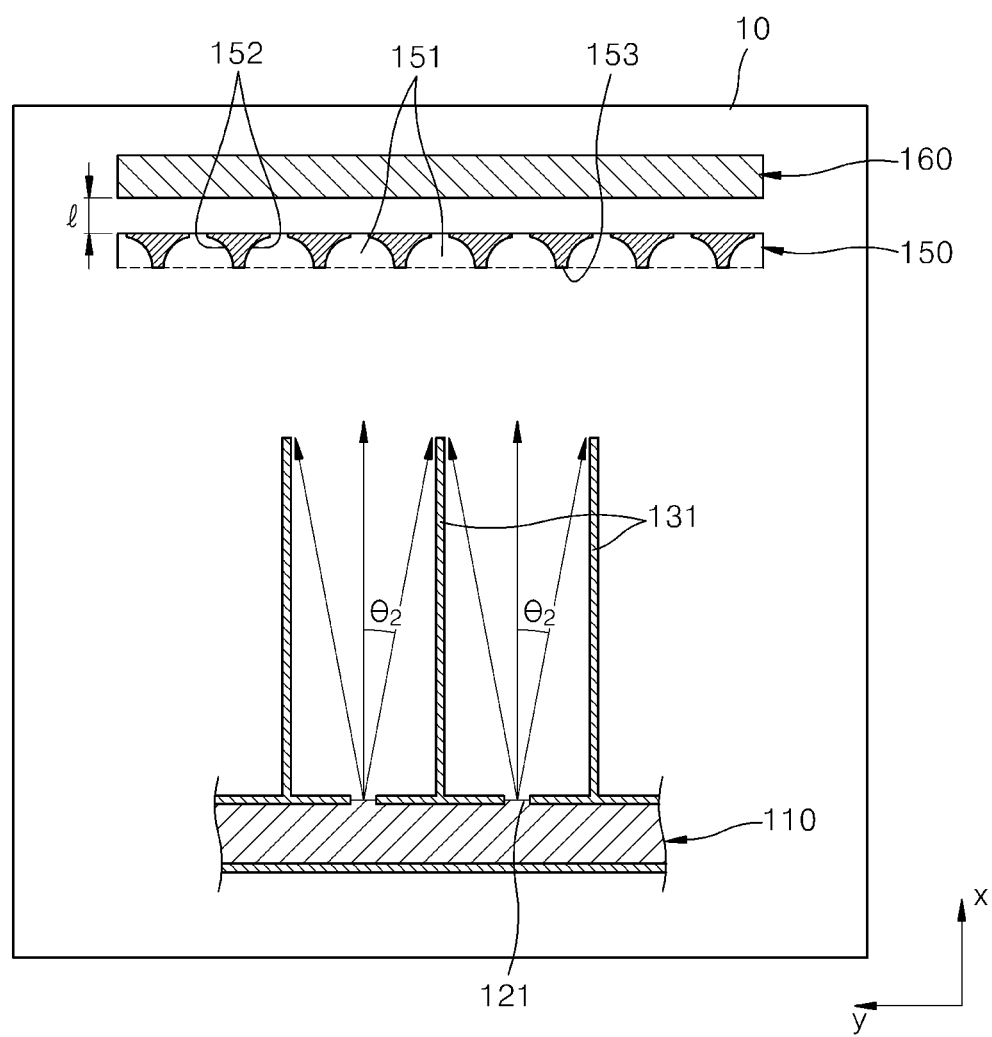
FIG. 3 is a schematic view illustrating deposition of an organic deposition material on a substrate for an OLED panel using a first nozzle-type mask in a deposition chamber.
Figure 4:
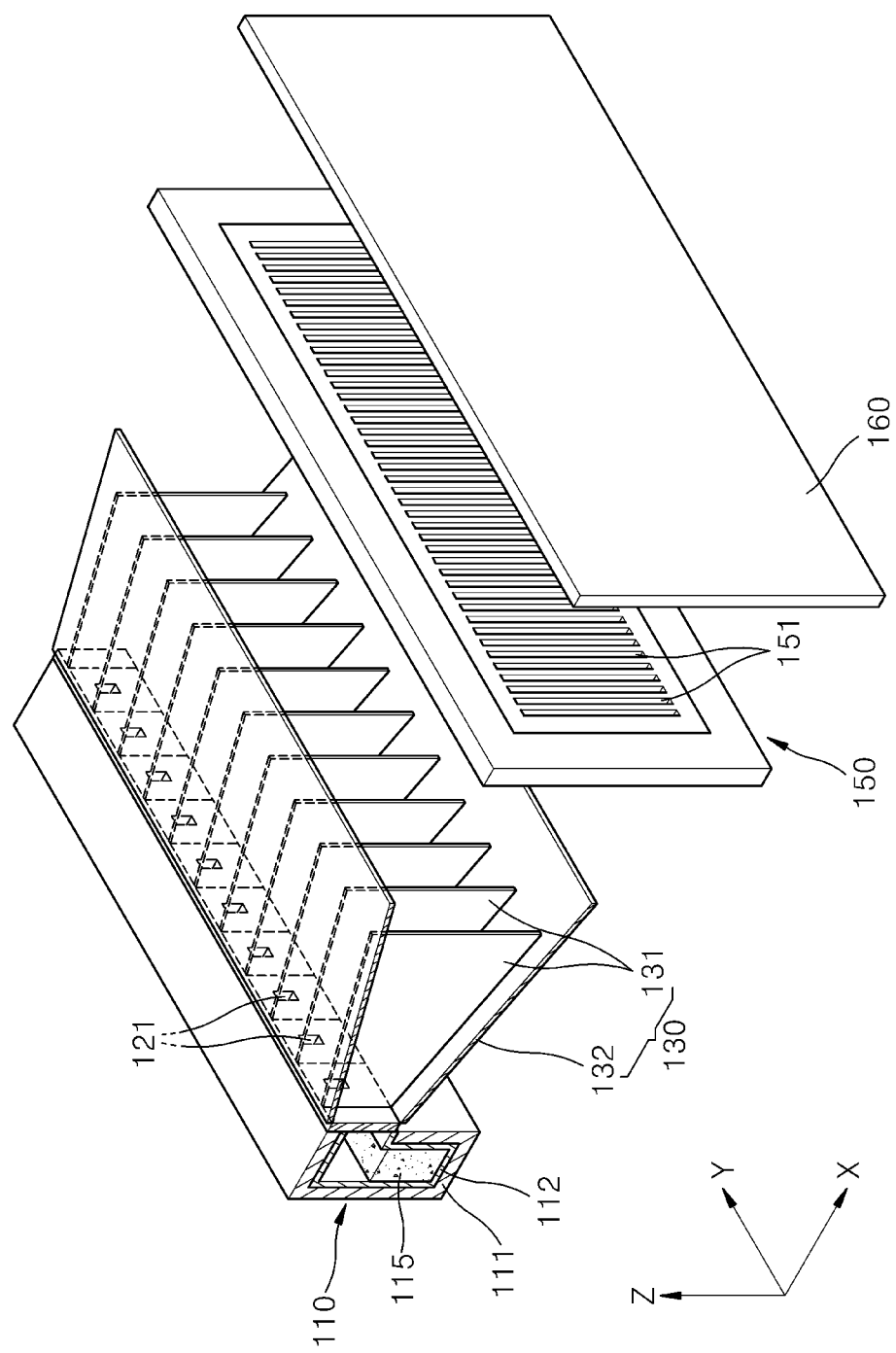
FIG. 4 is a perspective view of the deposition apparatus of FIG. 3.
Figure 5:
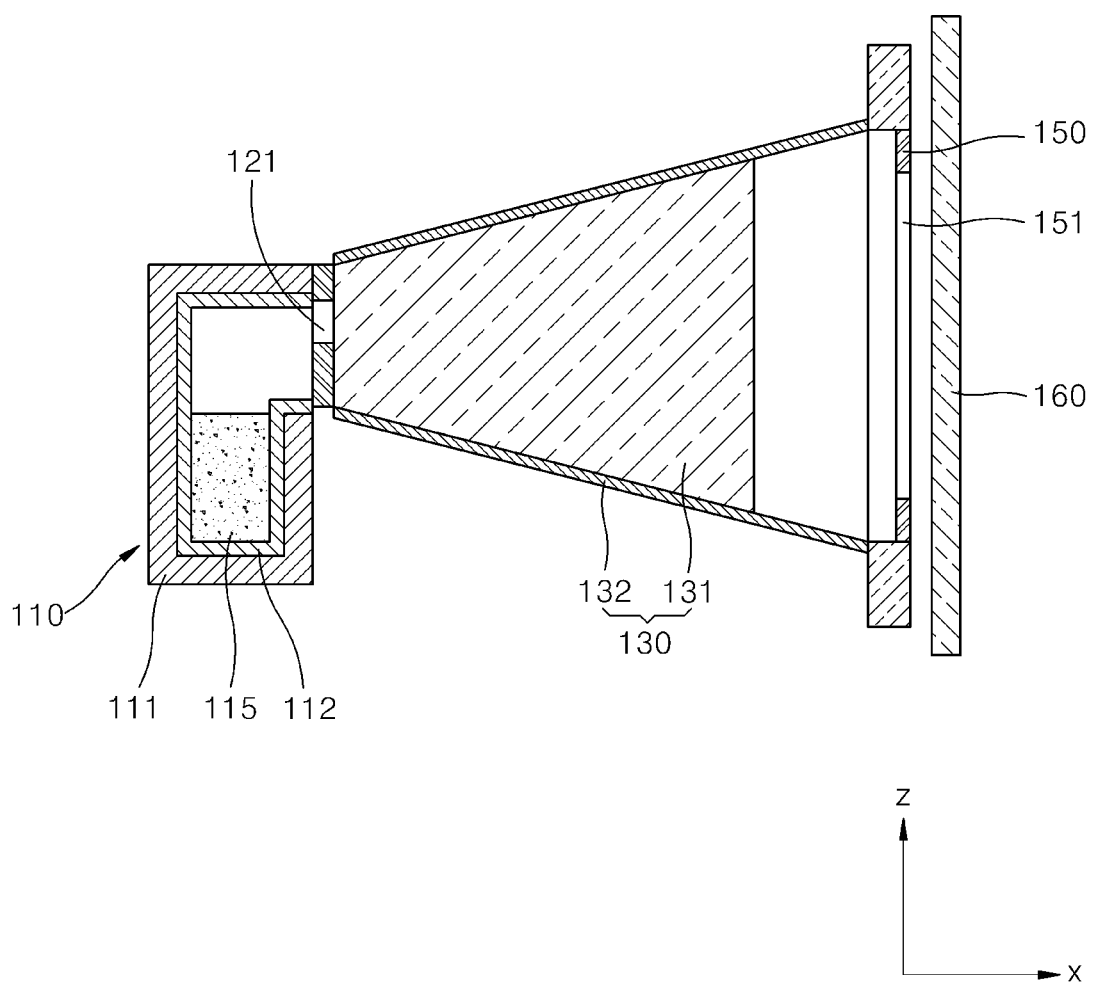
FIG. 5 is a schematic cross-sectional side view of FIG. 3.

FIG. 3 is a schematic view for describing deposition of an organic deposition material on a substrate 160 for an OLED panel using a first nozzle-type mask 150 in a deposition chamber 10. FIG. 4 is a perspective view of the deposition apparatus of FIG. 3. FIG. 5 is a schematic cross-sectional side view of FIG. 3.

Referring to FIGS. 3 to 5, a deposition of an organic deposition material on a substrate 160 for an OLED panel using a first nozzle-type mask 150 will be described.

The deposition using the first nozzle-type mask 150 is similar to that using the FMM 140 described above, in that the deposition using the first nozzle-type mask 150 also involves using a plurality of slots, referred herein as second slots 151. However, the deposition using the first nozzle-type mask 150 is different from that using the FMM 140 for the following reasons.

One difference between using the FMM 140 and using the first nozzle-type mask 150 is that the sizes of the masks are different. In detail, since the size of the FMM 140 is the same as the substrate 160, the FMM 140 is aligned to correspond to the substrate 160. By contrast, the deposition using the first nozzle-type mask 150 is performed while the first nozzle-type mask 150 is moved in the Z-axis direction within the deposition chamber 10. In other words, when deposition is completed by the first nozzle-type mask 150 at a first position of the substrate, the first nozzle-type mask 150 is moved in the Z-axis direction by the length of the first nozzle-type mask 150 and performs the deposition at a second position of the substrate. Thus, the first nozzle-type mask 150 may be much smaller than the FMM 140. That is, if the width of the first nozzle-type mask 150 in the Y-axis direction is the same as that of the substrate 160 in the Y-axis direction, the length of the first nozzle-type mask 150 in the Z-axis direction may be less than that of the substrate 160 in the Z-axis direction.

As described above, since the length of the first nozzle-type mask 150 may be far less than that of the FMM 140, it may be more convenient to manipulate the first nozzle-type mask 150 in all processes including etching, precise extension, welding, moving, and cleaning processes. This is more advantageous for a relatively large display device.

Another difference between using the FMM 140 and using the first nozzle-type mask 150 is that positions of the deposition sources relative to the masks and degrees of incidence angles of the organic deposition materials vaporized in the deposition sources are different with respect to the first nozzle-type mask as compared to the FMM 140. Referring to FIG. 2, when using the FMM 140, the deposition of the organic deposition material on the substrate 160 is performed by the FMM 140 while the deposition source 110 is moved relative to the FMM 140. However, referring to FIGS. 3 to 5, when using the first nozzle-type mask 150 the position of the first nozzle-type mask 150 is fixed relative to the deposition source 110. In addition, in the deposition using the FMM 140, the organic deposition material vaporized in the deposition source 110 is discharged at an angle up to about 55° with respect to the FMM 140. However, in the deposition using the first nozzle-type mask 150, the organic deposition material is discharged at an angle θ2 that is far less than that of the FMM 140. That is, the organic deposition material vaporized in the deposition source 110 is discharged more perpendicularly to the first nozzle-type mask 150 than to the FMM 140.

To control the deposition angle when using the first nozzle-type mask 150, a barrier wall assembly 130 including a plurality of barrier walls 131 that partition a space between the deposition source 110 and the first nozzle-type mask 150 into a plurality of sub-deposition spaces, each of which includes a first slit 121 through which the organic deposition material vaporized in the deposition source 110 is discharged is disposed between the deposition source 110 and the first nozzle-type mask 150. This will be described below in more detail.

In order to deposit an organic deposition material 115 that is discharged from the deposition source 110 through the first slits 121 and the second slots 151, on the substrate 160 in a desired pattern, the deposition chamber 10 should be maintained in a high-vacuum state as in a deposition method using the FMM 140. In order to maintain a high vacuum state, the temperatures of the barrier walls 131 and the first nozzle-type mask 150 should be sufficiently lower than the temperature of the deposition source 110. In this regard, the temperatures of the barrier walls 131 and the first nozzle-type mask 150 may be about 100° C. or less. If the temperature of the barrier wall assembly 130 and the second slots 151 is sufficiently low, the deposition material 115 that is radiated in an undesired direction is adsorbed to the surface of the barrier wall assembly 130, and high vacuum state may be maintained. In a high vacuum state, a straight motion of the particles of the deposition material may be achieved because the collisions between the particles of the deposition material typically do not occur.

The deposition source 110 that contains and heats the deposition material 115 is disposed in an opposite side of the deposition chamber 10 to where the substrate 160 is disposed. As the deposition material 115 contained in the deposition source 110 is vaporized, the deposition material 115 is deposited on the substrate 160. The deposition source 110 includes a crucible 111 that is filled with the deposition material 115, and a heater 112 that heats the crucible 111 to vaporize the deposition material 115, which is contained in the crucible 111, such that the vaporized deposition material is directed toward a side of the crucible 111, and in particular, towards the first slit 121.

The plurality of first slits 121 are disposed at a side of the deposition source 110, in particular, at the side of the deposition source 110 facing the substrate 160. In this regard, the first slits 121 may be arranged at equal intervals in the Y-axis direction. The deposition material 115 vaporized in the deposition source 110 passes through the first slits 121 toward the substrate 160.

The barrier wall assembly 130 is disposed between the first slits 121 and the first nozzle-type mask 150. The barrier wall assembly 130 includes the plurality of barrier walls 131 and a barrier wall frame 132 that covers sides of the barrier walls 131. The plurality of the barrier walls 131 may be arranged parallel to each other at equal intervals in the Y-axis direction. In addition, each of the barrier walls 131 may be formed to extend along an XZ plane in FIG. 4, i.e., perpendicular to the Y-axis direction. As described above, since the space between the deposition source 110 and the first nozzle-type mask 150 is partitioned by the barrier walls 131, the deposition material 115 discharged through one of the first slits 121 is not mixed with the deposition material 115 discharged through the other first slits 121, and is deposited on the substrate 160 through the second slots 151.

The barrier wall frame 132 may surround the plurality of barrier walls 131. The barrier wall frame 132, which covers upper and lower sides of the barrier walls 131, retains the positions of the barrier walls 131, and guides the deposition material 115, which is discharged through the first slits 121, not to deviate in a Z-axis direction.

In addition, the barrier wall assembly 130 may be constructed to be detachable from the first nozzle-type mask 150. Thus, deposition efficiency may be increased compared to the FMM deposition method. As used herein, the term "deposition efficiency" refers to the ratio of an amount of a deposition material deposited on a substrate to an amount of the deposition material vaporized from a deposition source. The FMM deposition method has a deposition efficiency of about 32%. In other words, in the conventional FMM deposition method, about 68% of organic deposition material, which has not been deposited on the substrate, remains adhered the inside of the deposition apparatus, such that it is not practical to reuse the deposition material. However, in the deposition method using the first nozzle-type mask 150, the deposition space is enclosed by using the barrier wall assembly 130, so that the deposition material that is not deposited on the substrate 160 is mostly deposited within the barrier wall assembly 130. Thus, when a large amount of the deposition material accumulates in the barrier wall assembly 130 after a long deposition process, the barrier wall assembly 130 may be detached from a thin film deposition apparatus, and then placed in a separate deposition material recycling apparatus to recover the deposition material. Due to this structure according to the present embodiment, a reuse rate of the deposition material is increased, so that the deposition efficiency is improved and manufacturing costs are reduced.

Although the barrier wall assembly 130 is in close contact with the first nozzle-type mask 150 according to the present embodiment, the present invention is not limited thereto. The barrier wall assembly 130 may be disposed to be separated from the first nozzle-type mask 150 by a predetermined distance to precisely align the first nozzle-type mask 150 and the substrate 160.

The organic deposition material that has not passed through the second slots 151 of the first nozzle-type mask 150 accumulates on bases 153 and boundaries 152 of the second slots 151 of the first nozzle-type mask 150.

Another difference between using the FMM 140 and using the first nozzle-type mask 150 is that distances between the masks and the substrates are different. In the deposition method using the FMM 140, deposition is performed with the FMM 140 in close contact with the substrate 160 in order to prevent the formation of a shadow zone on the substrate 160. However, when the FMM 140 is used in close contact with the substrate 160, the contact may cause defects. Accordingly, in the deposition method using the first nozzle-type mask 150, the first nozzle-type mask 150 is spaced apart from the substrate 160 by a predetermined distance (l). As described above, the size of the shadow zone formed on the substrate may be reduced by installing the barrier walls 131 between the deposition source 110 and the first nozzle-type mask 150. As a result, defects caused due to the contact between the substrate 160 and the first nozzle-type mask 150 may be prevented. Furthermore, since it is unnecessary to use the first nozzle-type mask 150 in close contact with the substrate 160 during a deposition process, the manufacturing speed may be improved. Since the first nozzle-type mask 150 may be separated from the substrate 160 and transported to a stock chamber 20 (see FIGS. 7 and 8), it is straightforward to clean the first nozzle-type mask 150 in the stock chamber 20.

Figure 6:
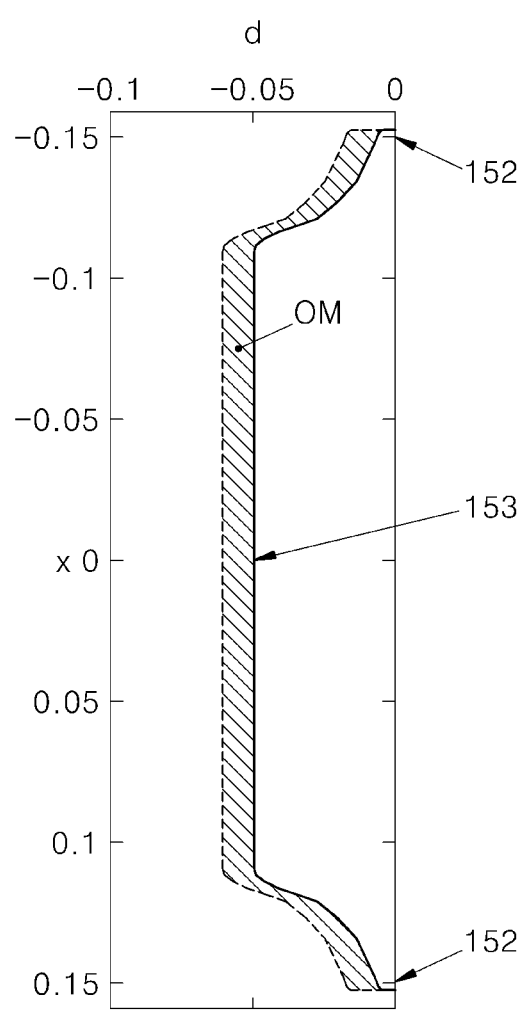
FIG. 6 schematically illustrates the amount of an organic deposition material accumulated according to the position of a nozzle-type mask.

FIG. 6 schematically illustrates the amount of an organic deposition material OM that may accumulate according to the position of a nozzle-type mask.

In FIG. 6, the vertical axis represents a distance x from the center of the first nozzle-type mask 150, and the horizontal axis represents a thickness d of the organic deposition material OM accumulated on the first nozzle-type mask 150.

The organic deposition material OM that is vaporized from the deposition source 110 but has not passed through the second slots 151 of the first nozzle-type mask 150 is accumulated on the bases 153 and the boundaries 152 of the first nozzle-type mask 150. The thickness of the organic deposition material OM accumulated on the boundaries 152 is about 20% of the thickness of the organic deposition material OM accumulated on the bases 153. That is, the amount of the organic deposition material OM accumulated on the boundaries 152 is lower than that accumulated on the bases 153. This result may be observed in the deposition using the FMM 140. In the deposition using the FMM 140, the organic deposition material vaporized in the deposition source 110 is discharged at an angle of about 55° or less with respect to the FMM 140. However, in the deposition using the first nozzle-type mask 150, the organic deposition material is discharged at an angle θ2 that is far less than that using the FMM 140. Thus, the rate at which the organic deposition material is accumulated on the boundaries 152 of the first nozzle-type mask 150 is slower than the rate at which the organic deposition material is accumulated on the boundaries 142 of the FMM 140.

Of the organic deposition material OM accumulated on the first nozzle-type mask 150, the organic deposition material OM accumulated on the boundaries 152 of the second slots 151 rather than the organic deposition material OM accumulated on the bases 153 of the first nozzle-type mask 150 directly influences the size of the organic deposition material pattern formed on the substrate 160. Thus, if the organic deposition material OM accumulated on the boundaries 152 of the second slots 151 is periodically removed during the deposition process, the number of PM cycles may be significantly reduced.

Figure 11:
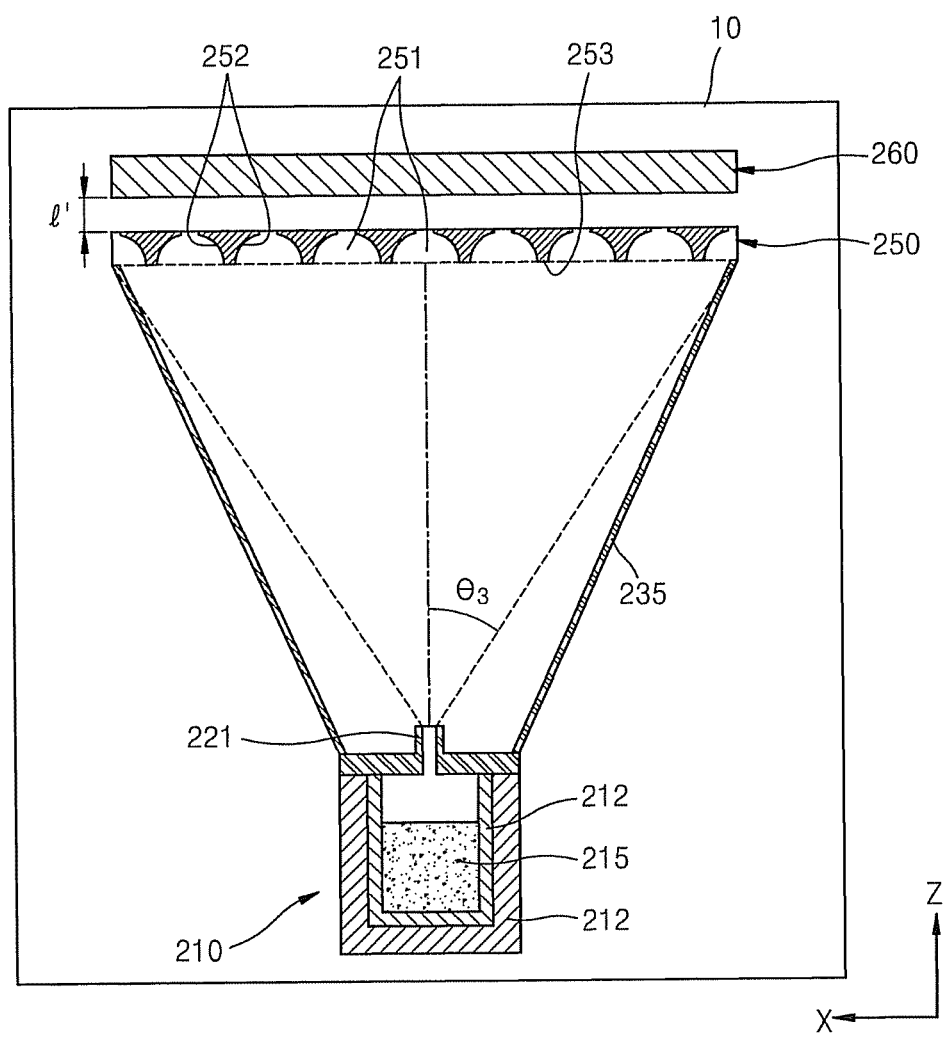
FIG. 11 is a schematic view illustrating deposition of an organic deposition material on a substrate for an OLED panel using a second nozzle-type mask in a deposition chamber.
Figure 12:
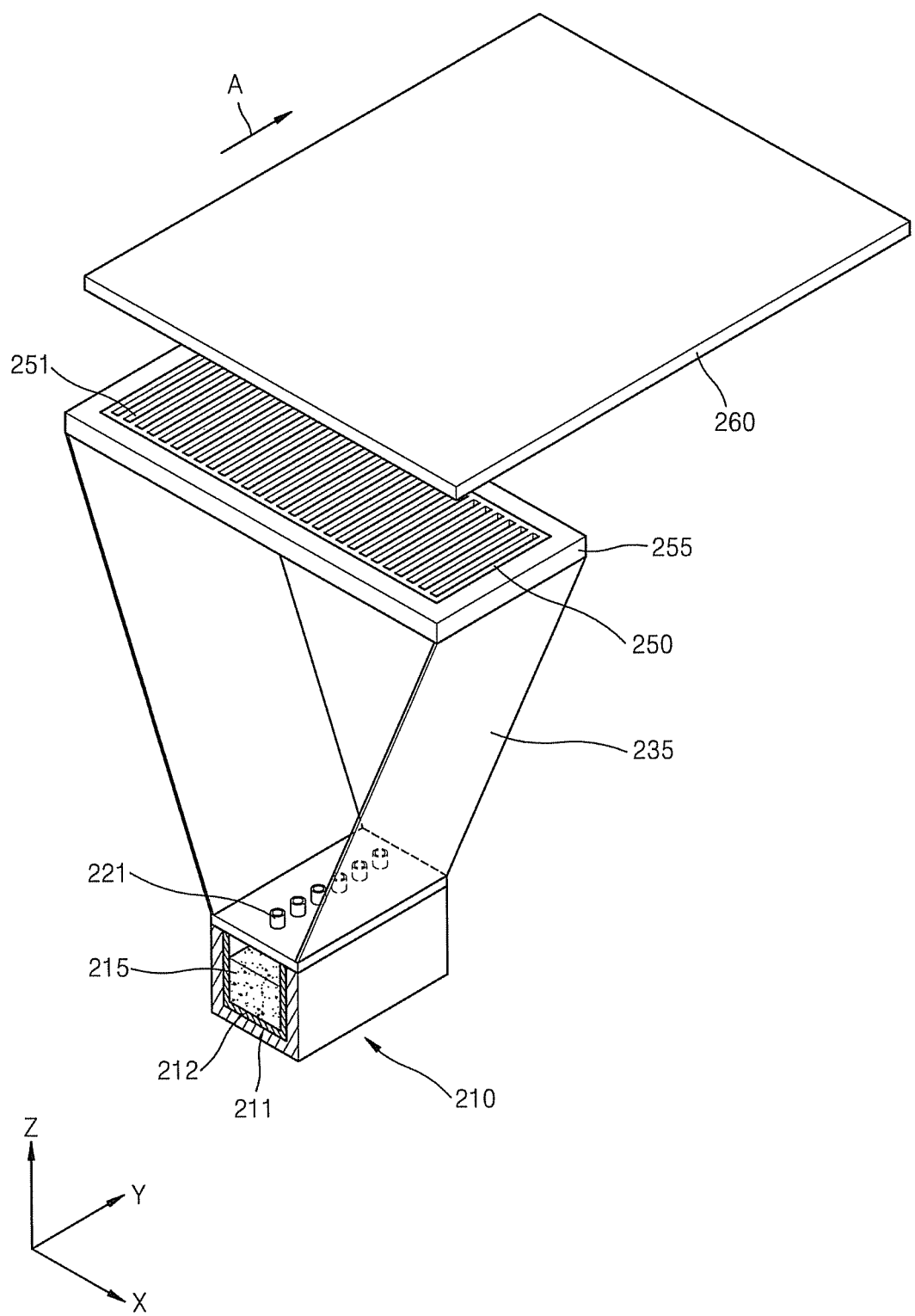
FIG. 12 is a perspective view of the deposition apparatus of FIG. 11.
Figure 13:
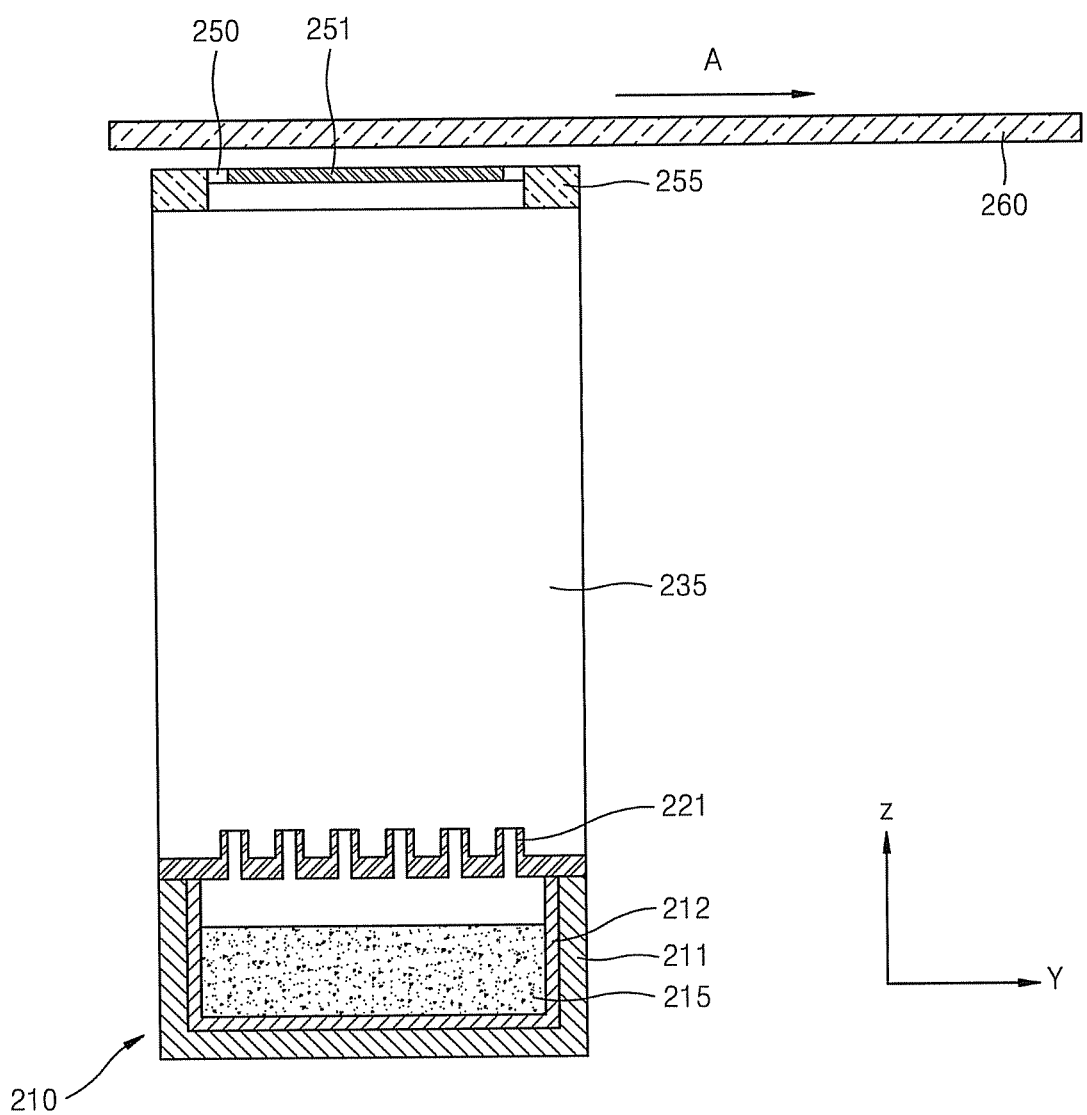
FIGS. 13 and 14 are schematic cross-sectional side view of FIG. 12.
Figure 14:
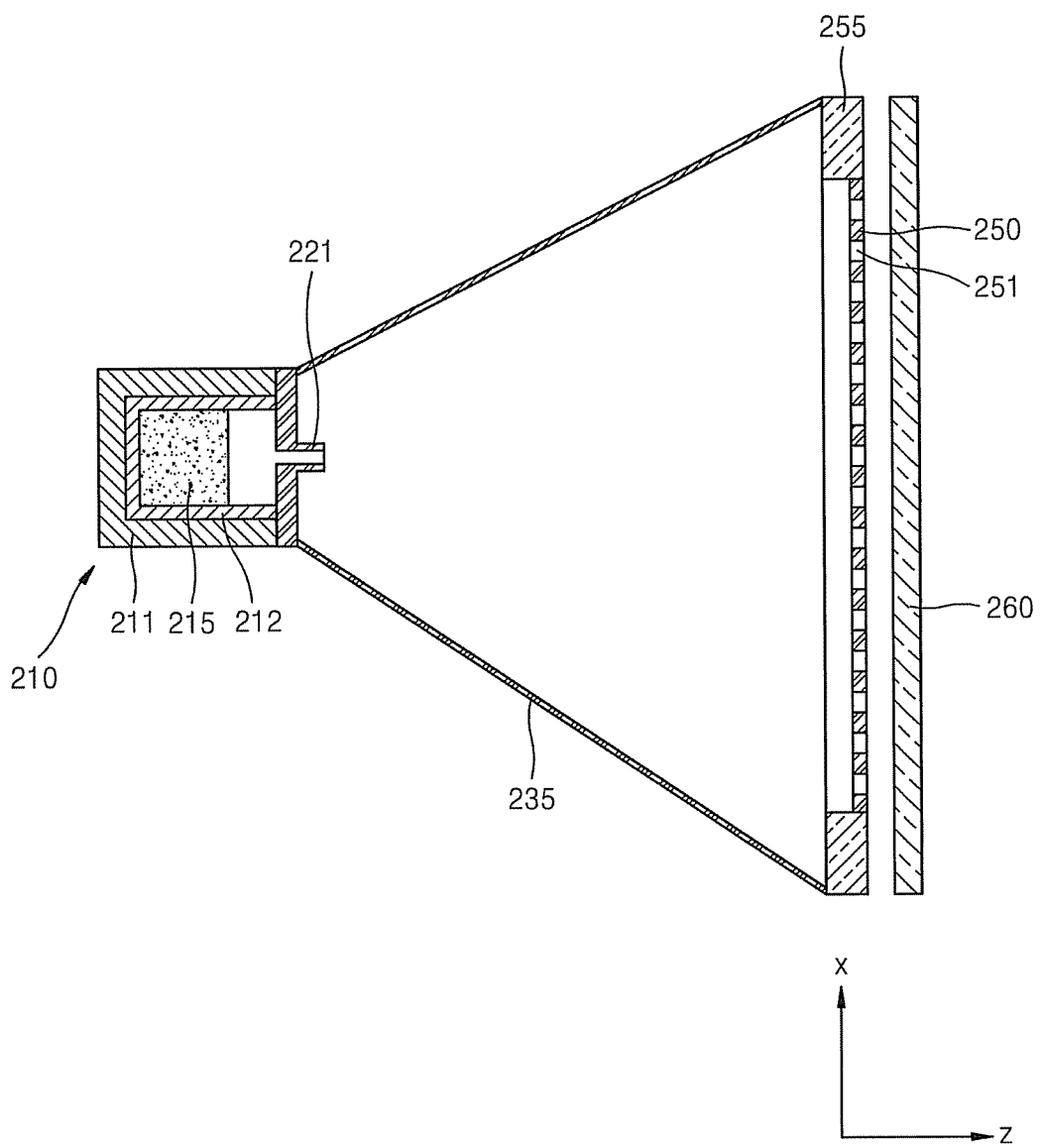

FIG. 11 is a schematic view illustrating deposition of an organic deposition material on a substrate for an OLED panel using a second nozzle-type mask in a deposition chamber. FIG. 12 is a perspective view of the deposition apparatus of FIG. 11. FIGS. 13 and 14 are schematic cross-sectional side view of FIG. 12.

Referring to FIGS. 12 to 14, a deposition of an organic deposition material on a substrate 260 for an OLED panel using a second nozzle-type mask 250 will be described and compared to the deposition using the FMM 140 and the deposition using the first nozzle-type mask 150 described above.

The deposition using the second nozzle-type mask 250 is similar to that using the FMM 140 and the first nozzle-type mask 150 described above, in that the deposition using the second nozzle-type mask 250 also involves using a plurality of slots, referred to herein as third slots 251.

In addition, the size of the second nozzle-type mask 250, like the first nozzle-type mask 150, may be less than that of the FMM 140. Specifically, the deposition is consecutively performed while the substrate 260 is moved in A direction (Y-axis direction). In other words, when deposition is completed by the second nozzle-type mask 250 at a current position, the substrate 260 is moved in the Y-axis direction by the length of the second nozzle-type mask 250 and the deposition is performed at the new position. Thus, the size of the second nozzle-type mask 250 may be far less than that of the FMM 140. That is, if the width of the second nozzle-type mask 250 in the X-axis direction is the same as that of the substrate 260 in the X-axis direction, the length of the second nozzle-type mask 250 in the Y-axis direction may be less than that of the substrate 260 in the Y-axis direction.

In addition, like the first nozzle-type mask 150, the position of the second nozzle-type mask 250 is fixed relative to a deposition source 210. However, even though the deposition source 210 is fixed, and the substrate 260 is moved according to FIGS. 12 to 14, the present invention is not limited thereto. The substrate 260 may be fixed, and the deposition source 210 may be moved.

In the apparatus used with the first nozzle-type mask 150, a plurality of barrier walls 131 that partition a space between the deposition source 110 and the first nozzle-type mask 150 into a plurality of sub-deposition spaces are disposed between the deposition source 110 and the first nozzle-type mask 150, and the barrier wall frame 132 that guides the deposition material discharged though the first slits 121 not to deviate in a Z-axis direction, is disposed. However, in the apparatus used with the second nozzle-type mask 250, a barrier wall is not disposed between the deposition source 210 and the second nozzle-type mask 250. Instead, only a connection member 235 that corresponds to the barrier wall frame 132 is disposed. Although the second nozzle-type mask 250 is formed in the left and right directions to guide the deposition material along the X-axis direction according to FIGS. 12 to 14 for descriptive convenience, the connection member 235 may be formed in a sealed box shape to simultaneously guide the deposition material in both directions of the X-axis and Y-axis directions. Thus, since there is no need to form the barrier walls, the configuration of the deposition apparatus may be simplified compared to the deposition apparatus using the first nozzle-type mask 150, and thus the deposition apparatus may be precisely controlled.

In addition, the second nozzle-type mask 250, like the first nozzle-type mask 150, is spaced apart from the substrate 260 by a predetermined distance (l'). In this regard, even though the barrier walls that are used for the first nozzle-type mask 150 are not disposed for the second nozzle-type mask 250, nozzle-type second slits 221 are disposed at a side of the deposition source 210 facing the substrate 260 in the Y-axis direction, i.e., along the scanning direction of the substrate 260, and the substrate 260 is moved in the Y-axis direction. Thus, the size of the pattern formed by the deposition material that passes through the third slots 251 of the second nozzle-type mask 250 is only influenced by the size of one nozzle-type second slit 221, and therefore a shadow may be reduced.

In addition, since the plurality of second slits 221 are arranged in the scanning direction, the difference of the deposition amount between the individual second slits 221 may be offset while deposition is performed in the scanning direction to obtain uniform deposition. As a result, defects caused due to the contact between the substrate 260 and the second nozzle-type mask 250 may be prevented. Furthermore, since it is unnecessary to use the second nozzle-type mask 250 in close contact with the substrate 260 during a deposition process, the manufacturing speed may be improved. Since the second nozzle-type mask 250 may be separated from the substrate 260 and transported to a stock chamber 20, it is straightforward to clean the second nozzle-type mask 250 in the stock chamber 20.

Organic deposition material that has not passed through the third slots 251 of the second nozzle-type mask 250 accumulates on bases 253 and boundaries 252 of the second nozzle-type mask 250.

As described above, in masks including a plurality of slots such as the FMM 140 including the first slots 141, the first nozzle-type mask 150 including the second slots 151, and the second nozzle-type mask 250 including the third slots 251, the masks need to be cleaned periodically to remove the organic deposition material that is accumulated on the boundaries of the slots.

Figure 7:
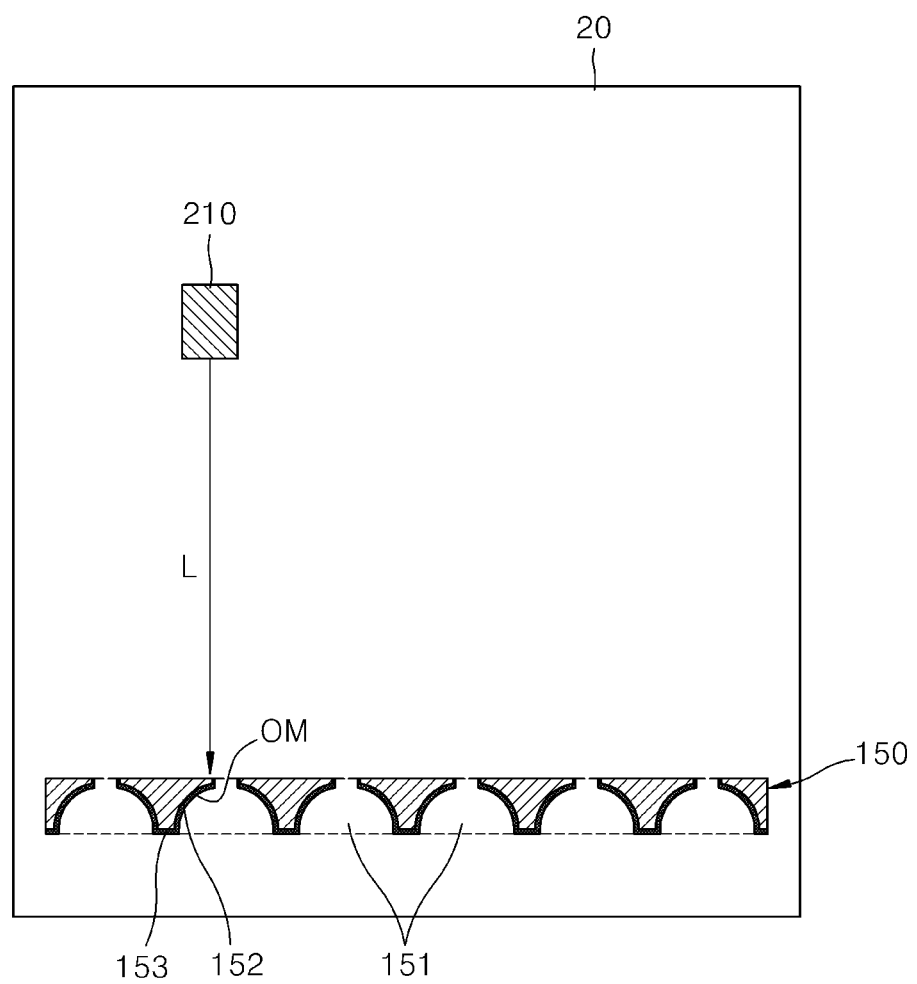
FIG. 7 is a schematic view illustrating an apparatus that irradiates a laser beam that scans an organic deposition material of a mask in a stock chamber.
Figure 8:
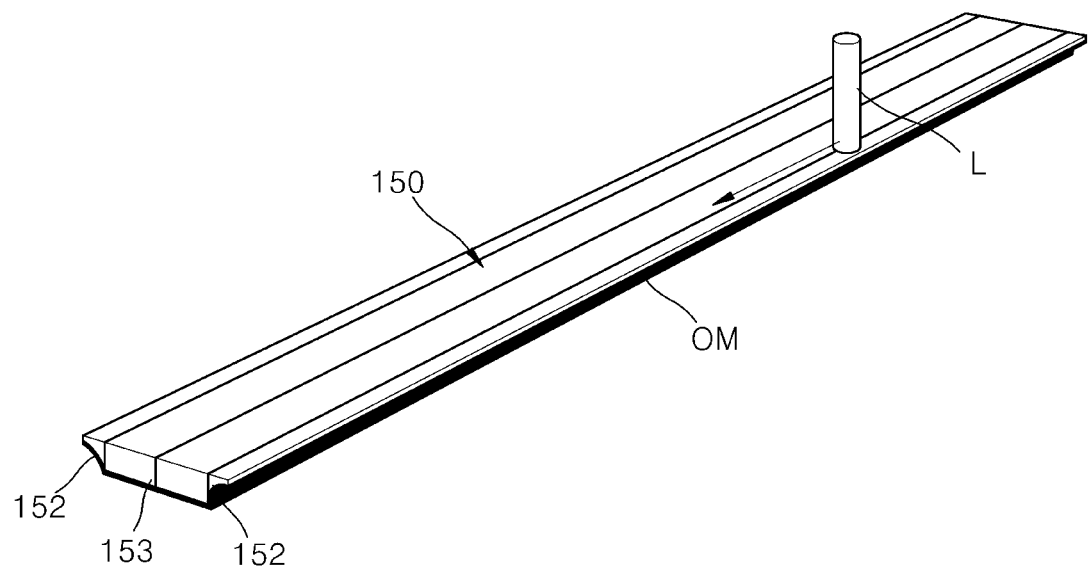
FIG. 8 is a schematic view illustrating a laser beam scanning along the boundary of a slot.

FIG. 7 is a schematic view illustrating an apparatus 210 that irradiates a laser beam that scans the organic deposition material OM of the first nozzle-type mask 150 in a stock chamber 20. FIG. 8 is a schematic view illustrating a laser beam scanning along the boundary of a slot.

Referring to FIGS. 7 and 8, the first nozzle-type mask 150 is disposed in the stock chamber 20. Meanwhile, although the first nozzle-type mask 150 is shown in FIGS. 7 and 8, aspects of the present invention may also be applied to the cleaning of other masks including a plurality of slots such as the FMM 140 and the second nozzle-type mask 250 which are described above. In this regard, the stock chamber 20 refers to a location in which the first nozzle-type mask 150 is stored, but is not limited thereto.

The stock chamber 20, constituting a component of a deposition apparatus, is maintained at a high vacuum, as is the deposition chamber 10. The degree of vacuum in the deposition chamber 10 may be substantially the same as that in the stock chamber 20, and may be less than 10E-7 Torr. Although not shown in FIGS. 7 and 8, the deposition chamber 10 may be disposed close to the stock chamber 20 or disposed apart from the stock chamber 20 as long as the degree of vacuum is maintained.

A transporting device (not shown) that transports the first nozzle-type mask 150 used in the deposition chamber 10 to the stock chamber 20 to clean the first nozzle-type mask 150 and transports the cleaned first nozzle-type mask 150 back to the deposition chamber 10, may further be disposed between the deposition chamber 10 and the stock chamber 20.

In addition, an opening and closing device (not shown) may further be disposed between the deposition chamber 10 and the stock chamber 20. Without an opening and closing device, the deposition material vaporized from the deposition source in the deposition chamber 10 may flow into the stock chamber 20. Thus, the stock chamber 20 may be isolated from the deposition chamber 10 by means of the opening and closing device while the mask cleaning process is performed in the stock chamber 20.

The apparatus 210 that irradiates a short wavelength laser beam disposed in the stock chamber 20 constitutes a mask cleaning device. As a non-limiting example, the apparatus 210 that irradiates a short wavelength laser beam may irradiate a laser beam with a wavelength ranging from 200 to 500 nm, which efficiently removes the organic deposition material. A laser beam generating device (not shown) may further be disposed in the stock chamber 20. A scanning device (not shown) that moves and controls the position of the apparatus 210 that irradiates a short wavelength laser beam may also be disposed in the stock chamber 20 such that the laser beam is irradiated to the target to be cleaned, i.e., the boundaries 152 of the second slots 151 of the first nozzle-type mask 150.

As described above, since the first nozzle-type mask 150 is spaced apart from the substrate 160 in the deposition chamber 10 by a predetermined distance (l), the first nozzle-type mask 150 may be transported by itself from the deposition chamber 10. The organic deposition material OM is locally cleaned while the apparatus 210 that irradiates a short wavelength laser beam scans the boundaries 152 of the second slots 151 of the first nozzle-type mask 150 that is transported into the stock chamber 20.

The apparatus 210 that irradiates a short wavelength laser beam may irradiate a spot-type laser beam L to the front or rear surface of the first nozzle-type mask 150 on the boundaries 152 of the second slots 151 of the first nozzle-type mask 150. In this regard, it is desirable to avoid irradiating the spot-type laser beam L inside the boundaries 152 of the first nozzle-type mask 150, i.e., to a side of the bases 153 because direct irradiation of the spot-type laser beam L to the bases 153 may cause thermal expansion of the first nozzle-type mask 150, thereby causing distortion of the first nozzle-type mask 150. If a spot-type laser beam L with a short wavelength is irradiated on the boundaries 152 of the first nozzle-type mask 150, the thermal energy of the spot-type laser beam L is transmitted to the organic deposition material OM accumulated on the boundaries 152 and the boundaries 152 of the first nozzle-type mask 150. The scan rate of the laser beam L may be determined such that the energy of the spot-type laser beam L reaches the organic deposition material OM accumulated on the boundaries 152 more quickly than the boundaries 152 of the first nozzle-type mask 150. Otherwise, the first nozzle-type mask 150 may be distorted by the thermal expansion of the boundaries 152 of the first nozzle-type mask 150. In this regard, the temperature of the organic deposition material OM accumulated on the boundaries 152 of the first nozzle-type mask 150, which is increased by the thermal energy, may be in the range of about 600° C. to about 1200° C. so that the organic deposition material OM may be sublimated at a pressure of about 10E-7 Torr or less.

The method of cleaning the boundaries 152 of the second slots 151 of the first nozzle-type mask 150 using the spot type laser beam L may also be applied to the deposition using the FMM 140.

Figure 9:
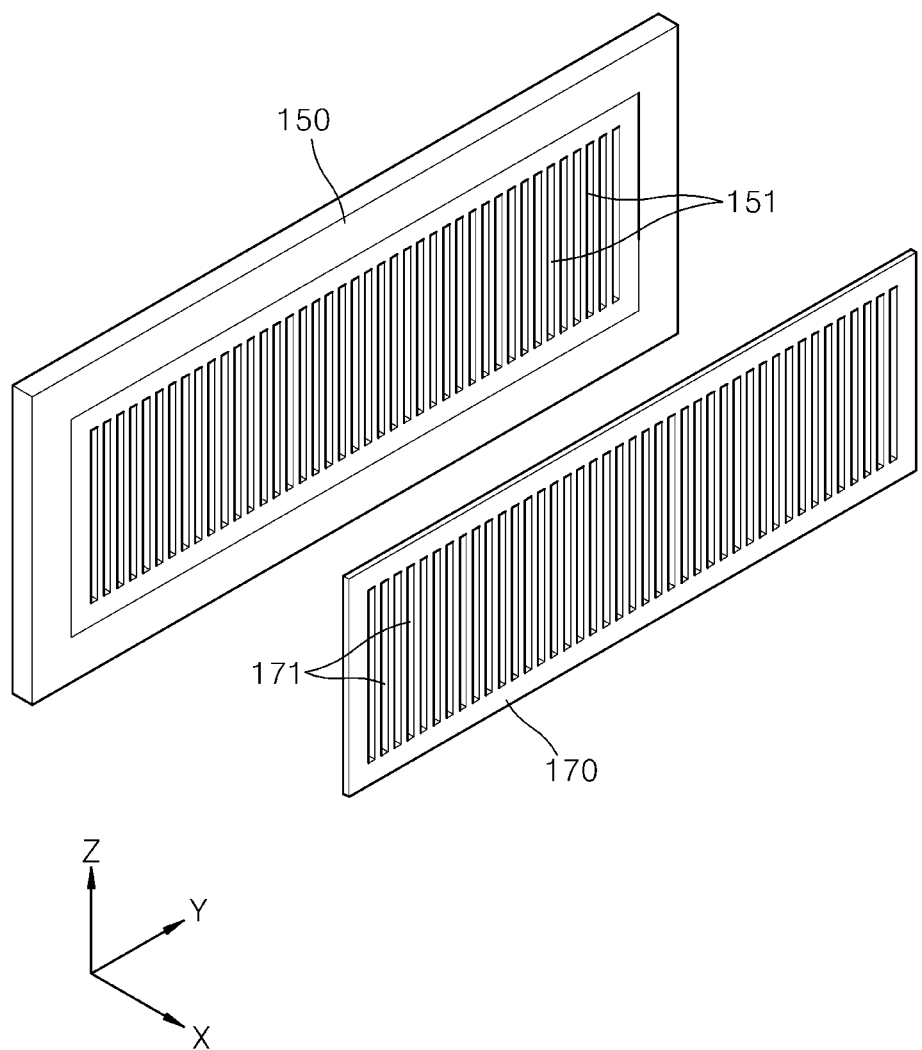
FIG. 9 is a schematic view illustrating a blocking mask arranged in front of a nozzle-type mask.
Figure 10:
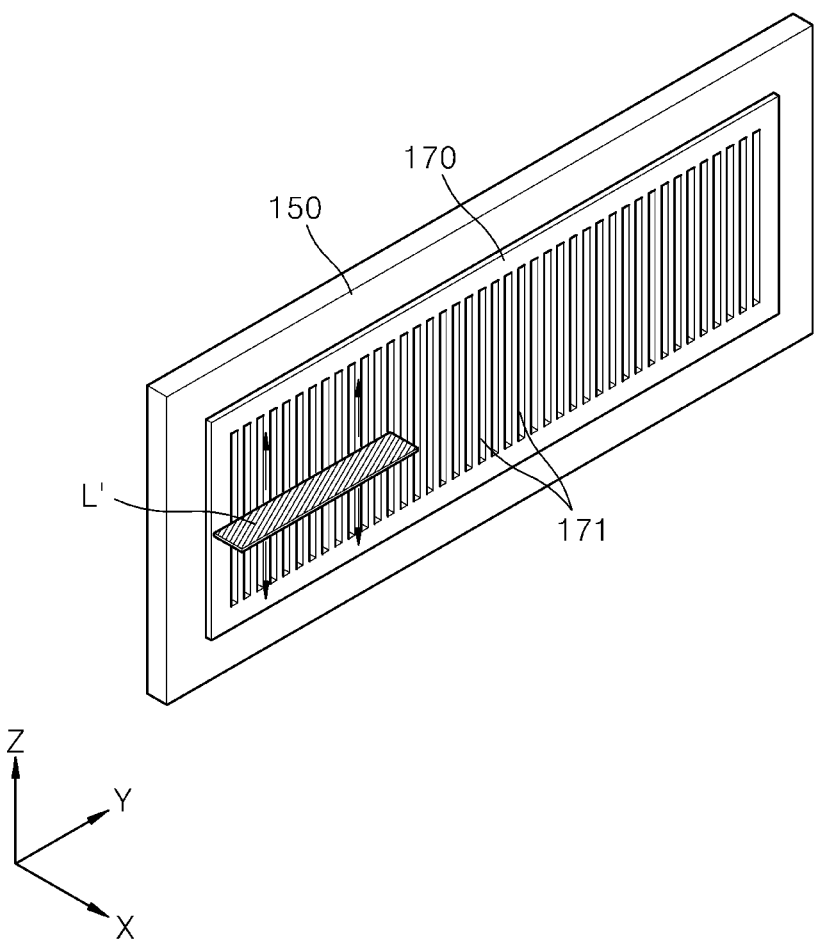
FIG. 10 is a schematic view illustrating the scanning of a nozzle-type mask using a line-type laser beam with a blocking mask.

A line-type short wavelength laser beam L' may also be used in the mask cleaning device when a blocking mask is used, as shown in FIGS. 9 and 10. In particular, FIG. 9 is a schematic view illustrating a blocking mask 170 arranged in front of the first nozzle-type mask 150 and FIG. 10 is a schematic view illustrating the scanning of the first nozzle-type mask 150 using a line-type laser beam with a blocking mask 170.

The spot type laser beam L described with reference to FIGS. 7 and 8 may be directly irradiated on the boundaries 152 of the second slots 151 of the first nozzle-type mask 150 by controlling pulses, but it takes a long time to scan the entire area of the boundaries 152 of the second slots 151. On the other hand, the line-type short wavelength laser beam L' has a predetermined length so as to be simultaneously irradiated on a plurality of boundaries 152 of the second slots 151. However, since the line-type short wavelength laser beam L' may also be irradiated on the bases 153 of the first nozzle-type mask 150, the temperature of the first nozzle-type mask 150 may increase. Thus, a blocking mask 170 is disposed between the first nozzle-type mask 150 and the line-type short wavelength laser beam L'.

The blocking mask 170 has a slit pattern 171 with openings corresponding to boundaries 152 of the second slots 151 of the first nozzle-type mask 150. The blocking mask 170 may be prepared by deposing a metal layer on a soda lime glass.

The blocking mask 170 having the slit pattern 171 is disposed in front of the first nozzle-type mask 150 such that the slit pattern 171 aligns with the boundaries 152 of the second slots 151 of the first nozzle-type mask 150. The line-type short wavelength laser beam L' is irradiated to the first nozzle-type mask 150 with the blocking mask 170 disposed in front of the first nozzle-type mask 150.

The line-type short wavelength laser beam L' passes through the plurality of slit patterns 171 formed in the blocking mask 170 to reach the plurality of boundaries 152 of the second slots 151 of the first nozzle-type mask 150. That is, since the line-type short wavelength laser beam L' is irradiated not on the bases 153 of the first nozzle-type mask 150 but on the boundaries 152 of the second slots 151, the organic deposition material accumulated only on the boundaries 152 of the second slots 151 of the first nozzle-type mask 150 may be cleaned while the increase in the temperature of the first nozzle-type mask 150 is prevented.

The line-type short wavelength laser beam L' may have a variety of line widths. If the width of the line-type short wavelength laser beam L' is the same as that of the first nozzle-type mask 150, the cleaning time may be reduced by scanning the first nozzle-type mask 150 in the lengthwise direction, i.e., in the Z-axis direction, of the second slots 151 of the first nozzle-type mask 150.

The mask cleaning device may use UV rays or plasma in addition to the line-type short wavelength laser beam L'. The line-type short wavelength laser beam L' may be efficiently used to partially clean the organic deposition material OM on the boundaries 152 of the second slots 151. However, cleaning efficiency may be increased using UV rays or plasma, since the entire first nozzle-type mask 150 may be cleaned, and a plurality of the nozzle-type masks 150 may be cleaned in the stock chamber 20.

The mask cleaning device using UV rays or plasma may also be used to partially clean the mask. However, it is not easy to locally irradiate the UV rays or plasma to the boundaries 152 of the second slots 151 of the first nozzle-type mask 150. Thus, the blocking mask 170 that blocks the bases 153 of the first nozzle-type mask 150 may also be disposed between the first nozzle-type mask 150 and the UV rays or plasma. Since the UV rays and plasma may be irradiated to the entire first nozzle-type mask 150, the cleaning time may be reduced compared to using the spot-type laser beam L or the line-type short wavelength laser beam L'.

As described above, according to aspects of the present invention, since the organic deposition material accumulated on the mask may be cleaned in the stock chamber while the deposition process is performed, there is no need to stop the deposition process and perform a separate PM in order to clean the mask. Thus, the PM cycle of the entire deposition process may be extended.

In addition, when a partial cleaning process is performed along boundaries of the second slits of the mask which strongly affect the formation of the pattern instead of cleaning the entire mask, the cleaning cycle of the mask may be extended.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method of cleaning off an organic deposition material accumulated on a mask used to form an organic deposition material pattern on a substrate, the method comprising:
    forming the organic deposition material pattern on the substrate using the mask separated from a substrate by a set distance in a deposition chamber comprising a deposition source, while the mask or the substrate is moved relative to the other, wherein the mask comprises a plurality of slots;
    locating a barrier wall assembly comprising a plurality of barrier walls that partition a space between the mask and the substrate into a plurality of sub-deposition spaces;
    transporting the mask to a stock chamber that is maintained at a vacuum and that is adjacent to the deposition chamber; and
    cleaning off the organic deposition material accumulated on the mask in the stock chamber.

2. The method of claim 1, wherein boundaries of the slots are inclined.

3. The method of claim 1, wherein the slots are disposed to be substantially parallel to each other and extend in a predetermined direction.

4. The method of claim 1, wherein the substrate on which the organic deposition material pattern is formed comprises a substrate for an organic light emitting device (OLED) panel.

5. The method of claim 4, wherein at least one organic deposition material selected from the group consisting of organic deposition materials used to form an emission layer, an electron injection layer, an electron transport layer, a hole injection layer, and a hole transport layer is deposited on the substrate for the OLED panel.

6. The method of claim 1, wherein the organic deposition material pattern is formed by disposing the mask in close contact with the substrate, and depositing the organic deposition material on the substrate while the deposition source is moved relative to the mask.

7. The method of claim 1, wherein a plurality of first slits are disposed along a first direction at one side of the deposition source, and
wherein the barrier wall assembly further comprises a barrier wall frame that surrounds the barrier walls and is located between the deposition source and the mask, wherein the barrier wall assembly and the mask are detachable.

8. The method of claim 7, wherein the plurality of first slits formed in the mask provide a portion of the organic deposition material pattern to be formed on the substrate, and deposition of the organic deposition material on the substrate is conducted by scanning the mask along a direction perpendicular to the first direction with respect to the substrate.

9. The method of claim 1, wherein a plurality of second slits are disposed along a first direction at one side of the deposition source, and
a connection member that guides the deposition material which is discharged from the deposition source to the substrate is disposed between the deposition source and the mask, wherein the connection member and the mask are detachable.

10. The method of claim 9, wherein the plurality of second slits formed in the mask provide a portion of the organic deposition material pattern to be formed on the substrate, and deposition of the organic deposition material on the substrate is conducted by scanning the substrate along the first direction with respect to the mask.

11. The method of claim 1, wherein the cleaning off of the organic deposition material is performed using plasma.

12. The method of claim 1, wherein the cleaning off of the organic deposition material is performed by cleaning off the organic deposition material accumulated along boundaries of the slots formed in the mask.

13. The method of claim 12, wherein the cleaning off of the organic deposition material is performed using a short wavelength laser beam.

14. The method of claim 13, wherein the short wavelength laser beam has a wavelength ranging from 200 nm to 500 nm.

15. The method of claim 13, wherein the short wavelength laser beam is irradiated substantially perpendicular to the surface of the mask facing the substrate.

16. The method of claim 13, wherein the scan rate of the short wavelength laser beam is determined such that the energy of the short wavelength laser beam reaches the organic deposition material more quickly than the energy reaches the mask.

17. The method of claim 13, wherein the temperature of the organic deposition material to which the short wavelength laser beam is irradiated is in the range of 600° C. to 1200° C.

18. The method of claim 12, wherein the cleaning off of the organic deposition material is performed by further disposing a blocking mask having a pattern with a plurality of openings corresponding to the boundaries of the slots of the mask in front of the mask.

19. The method of claim 18, wherein the cleaning off of the organic deposition material is performed using a line-type short wavelength laser beam simultaneously irradiated to the plurality of openings contained in the blocking mask.

20. The method of claim 18, wherein the cleaning off of the organic deposition material is performed using UV rays.

21. The method of claim 18, wherein the cleaning off of the organic deposition material is performed using plasma.

22. The method of claim 1, wherein the forming the organic deposition material pattern and the cleaning off of the organic deposition material are performed at substantially the same degree of vacuum.

23. The method of claim 22, wherein the degrees of vacuum of the deposition chamber and the stock chamber are maintained at about 10E-7 Torr or less.

24. The method of claim 22, wherein the mask is maintained in a vacuum when the mask is transported from the deposition chamber to the stock chamber.

25. The method of claim 1, further comprising transporting the mask from the stock chamber to the deposition chamber after the organic deposition material accumulated on the mask has been cleaned off.

26. The method of claim 25, wherein the mask is maintained in a vacuum when the mask is transported from the stock chamber to the deposition chamber.

27. The method of claim 1, wherein the organic deposition material is deposited on the substrate while the deposition source is fixed relative to the mask.

* * * * *